(12) United States Patent
Miyazaki

(10) Patent No.: US 10,811,095 B2
(45) Date of Patent: Oct. 20, 2020

(54) SEMICONDUCTOR STORAGE DEVICE

(71) Applicant: TOSHIBA MEMORY CORPORATION, Minato-ku, Tokyo (JP)

(72) Inventor: Takayuki Miyazaki, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/546,614

(22) Filed: Aug. 21, 2019

(65) Prior Publication Data

US 2020/0303002 A1 Sep. 24, 2020

(30) Foreign Application Priority Data

Mar. 19, 2019 (JP) .................................. 2019-051010

(51) Int. Cl.
G11C 7/08 (2006.01)
G11C 13/00 (2006.01)

(52) U.S. Cl.
CPC .............. G11C 13/004 (2013.01); G11C 7/08 (2013.01); G11C 13/0004 (2013.01); G11C 13/0026 (2013.01); G11C 13/0028 (2013.01); G11C 13/0038 (2013.01); G11C 2013/0045 (2013.01)

(58) Field of Classification Search
CPC ..... G11C 13/004; G11C 13/0028; G11C 7/08; G11C 13/0026; G11C 13/0004; G11C 13/0038; G11C 2013/0045
See application file for complete search history.

(56) References Cited

U.S. PATENT DOCUMENTS

| 9,030,906 | B2 | 5/2015 | Rivers | |
|---|---|---|---|---|
| 9,142,271 | B1 | 9/2015 | Srinivasan | |
| 9,747,978 | B2 | 8/2017 | Srinivasan | |
| 2007/0019464 | A1* | 1/2007 | Ezaki | G11C 11/16 365/158 |
| 2013/0250653 | A1* | 9/2013 | Ueda | G11C 11/1693 365/148 |
| 2019/0306442 | A1* | 10/2019 | Murakami | H04N 5/355 |

OTHER PUBLICATIONS

Itoh, "VLSI Memory Chip Design", Springer, 2001, XI, Fig.3.56(a).

* cited by examiner

*Primary Examiner* — Mohammed A Bashar
(74) *Attorney, Agent, or Firm* — Foley & Lardner LLP

(57) ABSTRACT

A semiconductor storage device includes first lines second lines, and memory cells. The detection circuit detects data stored in the memory cells. A first transistor is electrically connected to the second lines between the memory cells and the detection circuit. A controller brings the first transistor to an intermediate state between an on-state and an off-state and thereafter brings the first transistor to the on-state to transmit a voltage of the second line to the detection circuit, in a data read operation, while a read voltage is applied to a first memory cell among the memory cells, the first memory cell being connected to a selected first line selectively driven from among the first lines and connected to a selected second line selectively driven from among the second lines, and the first transistor connected to the selected second line.

20 Claims, 7 Drawing Sheets

SEMICONDUCTOR STORAGE DEVICE

CROSS REFERENCE TO RELATED APPLICATIONS

This application is based upon and claims the benefit of priority from the prior Japanese Patent Application No. 2019-051010, filed on Mar. 19, 2019, the entire contents of which are incorporated herein by reference.

FIELD

The embodiments of the present invention relate to a semiconductor storage device.

BACKGROUND

Semiconductor storage devices such as a NAND flash memory have been downscaled to increase the storage capacity. In order to realize further downscaling, development of memories using a new material is progressing. For example, new memories such as a resistance random access memory (ReRAM) and a phase-change memory (PCM) are developed.

In a read operation of these new memories, a method is often used in which charges according to the resistance state of a selected cell are accumulated in a selected bit line and data in the selected cell is detected on the basis of the voltage of the selected bit line. In this case, a relatively-large voltage difference is applied to the selected cell arranged in the intersection area between the selected bit line and a selected word line. Meanwhile, other non-selected cells connected to the selected bit line are in a half-selected state because a relatively-small voltage difference between non-selected word lines and the selected bit line is applied thereto. If a current leaks from these memory cells in a half-selected state, the voltage of the selected bit line changes and there is a risk that data in the selected cell cannot be accurately detected.

DETAILED DESCRIPTION

Figure 1:
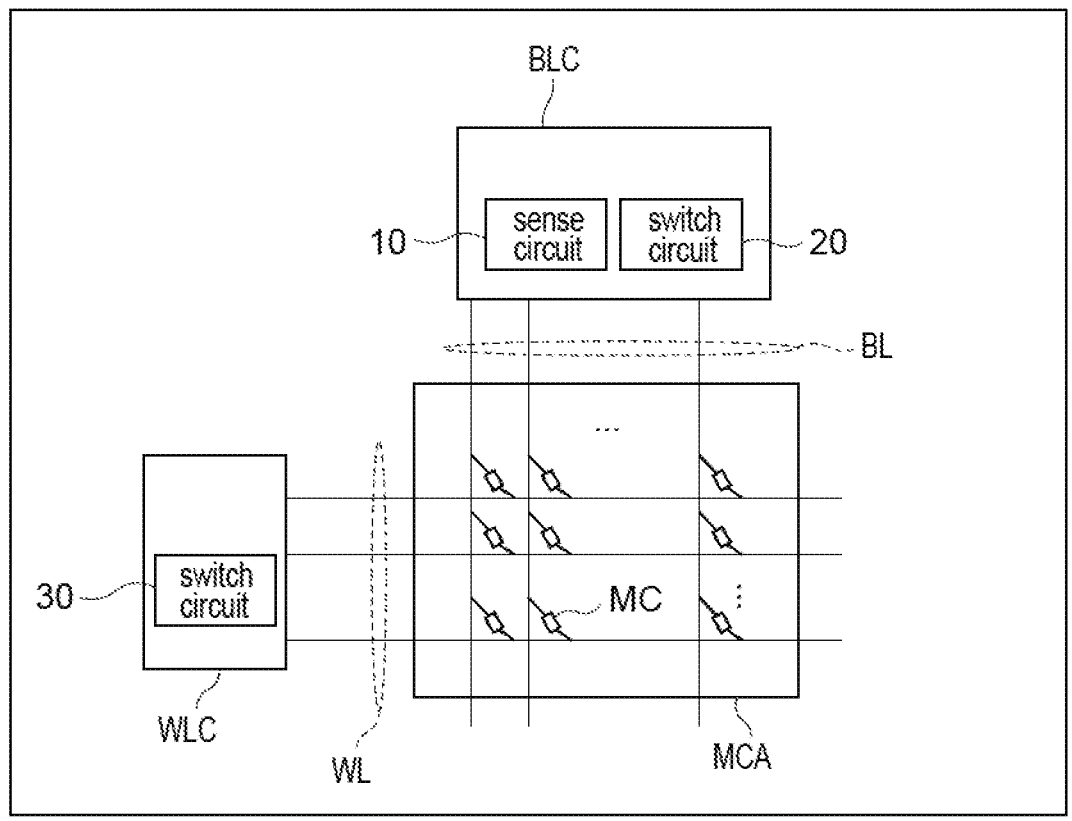
FIG. 1 is a block diagram illustrating a configuration example of a memory chip according to a first embodiment.

Embodiments will now be explained with reference to the accompanying drawings. The present invention is not limited to the embodiments. The drawings are schematic or conceptual, and the ratios and the like among respective parts are not the same as those of actual products. In the present specification and the drawings, elements identical to those described in the foregoing drawings are denoted by like reference characters and detailed explanations thereof are omitted as appropriate.

A semiconductor storage device according to an embodiment comprises: a plurality of first lines; a plurality of second lines; a plurality of memory cells arranged to correspond to intersection areas between the first lines and the second lines. The detection circuit is configured to detect data stored in the memory cells. A first transistor is electrically connected to the second lines between the memory cells and the detection circuit. A controller is configured to bring the first transistor to an intermediate state between an on-state and an off-state and to thereafter bring the first transistor to the on-state to transmit a voltage of the second line to the detection circuit, in a data read operation, while a read voltage is applied to a first memory cell among the memory cells, the first memory cell being connected to a selected first line selectively driven from among the first lines and connected to a selected second line selectively driven from among the second lines, and the first transistor connected to the selected second line.

The following embodiments can be applied to any type of memories such as a ReRAM, a PRAM (Phase-Change RAM), a PCM, an iPCM, an MRAM (magnetic random access memory).

First Embodiment

FIG. 1 is a block diagram illustrating a configuration example of a memory chip 1 according to a first embodiment. The memory chip 1 includes a plurality of word lines WL, a plurality of bit lines BL, a memory cell array MCA, a word line controller WLC, and a bit line controller BLC. Although not illustrated, a selector that selects one of the word lines WL to be connected to the word line controller WLC or a selector that selects one of the bit lines BL to be connected to the bit line controller BLC may be provided between the memory cell array MCA and the word line controller WLC or between the memory cell array MCA and the bit line controller BLC.

The word lines WL and the bit lines BL intersect to be substantially orthogonal to each other and a memory cell MC is provided to correspond to each of intersection areas therebetween. The memory cell array MCA includes a plurality of the memory cells MC arrayed two-dimensionally or three-dimensionally.

The bit line controller BLC includes a sense circuit 10 and a switch circuit 20. The sense circuit 10 is electrically connectable to the memory cells MC via the corresponding bit lines BL and detects logic of data stored in the memory cells MC. The switch circuit 20 includes switches (transistors) between the sense circuit 10 and the bit lines BL, and a control circuit therefor. A switch circuit 30 includes switches (transistors) between the sense circuit 10 and the word lines WL, and a control circuit therefor.

The bit line controller BLC further includes a page buffer, a column decoder, and the like although they are not illustrated. The word line controller WLC further includes a word line driver, a row decoder, and the like. The memory chip 1 further includes an internal-voltage generation circuit, a sequence controller, a logic controller, an address register, an input/output buffer, and the like.

The internal-voltage generation circuit includes a step-up circuit that generates a higher potential than external power with a charge pump circuit, a source-follower step-down transistor, a circuit that generates an internal step-down potential from the external power, a BGR (Band-Gap-Reference) circuit serving as a reference-potential generation circuit that generates a constant potential regardless of temperatures and power-supply voltages, and the like.

The row decoder and the word line driver selectively step up and drive one of the word lines WL. The column decoder, the sense circuit 10, and the page buffer selectively step down and drive one of the bit lines BL, detect (read) data in a memory cell MC via the selected bit line BL, and temporarily store the read data therein. The column decoder and the page buffer temporarily store write data therein and write the write data into a memory cell MC via a selected bit line BL.

The address register receives address signals via the input/output buffer and retains the received address signals. The address register transfers a row address signal and a column address signal to the row decoder and the column decoder, respectively The logic controller controls input of a command or address signals and controls input/output of read data or write data on the basis of a control signal such as a chip enable signal, a command enable signal, an address-latch enable signal, a write enable signal, or a read enable signal. A read operation or a write operation is performed in accordance with the command.

The memory cells MC are phase-change elements (PCMs, for example) each connected in series between a bit line BL and a word line WL. When a current is passed through a PCM, the phase of the phase-change film transitions and therefore the PCM element is brought to a low-resistance state (a set state) or a high-resistance state (a reset state). This enables the PCM to store logical data therein. For example, when the low-resistance state (the set state) is assumed to be data "0 (zero)" and the high-resistance state (the reset state) is assumed to be data "1", the PCM can store one bit of logical data therein.

Figure 2:
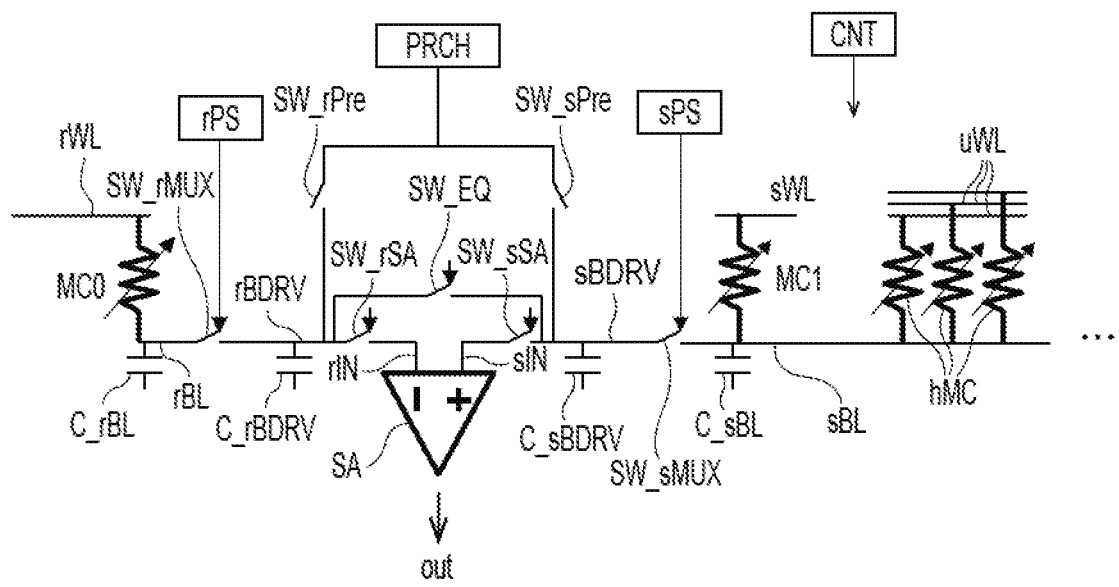
FIG. 2 is an equivalent circuit diagram illustrating a connection relation between the memory cells and the sense circuit in a data read operation.

FIG. 2 is an equivalent circuit diagram illustrating a connection relation between the memory cells MC and the sense circuit 10 in a data read operation. The memory chip 1 includes sense amplifiers SA, non-selected memory cells MC0, selected memory cells MC1, non-selected memory cells (half-selected memory cells) hMC, a selected bit line sBL, non-selected bit lines rBL, a selected word line sWL, non-selected word lines uWL and rWL, a precharge circuit PRCH, a controller CNT, and voltage sources sPS and rPS, switches SW_sMUX, SW_rMUX, SW_sSA, SW_rSA, SW_sPre, SW_rPre, and SW_EQ. The constituent elements in FIG. 2 are included in the sense circuit 10 or the switch circuit 20 in the bit line controller BLC in FIG. 1. The switches SW_sMUX, SW_rMUX, SW_sSA, SW_rSA, SW_sPre, SW_rPre, and SW_EQ are all constituted by MOS (Metal Oxide Semiconductor) transistors and can be brought to an on-state (a conducting state) or an off-state (a non-conducting state). In the present embodiment, the switches SW_sMUX, SW_rMUX, SW_sSA, SW_rSA, SW_sPre, SW_rPre, and SW_EQ are all N-type MOSFETs (MOS Field-Effect Transistors) However, some or all of these switches may be constituted by P-type MOSFETs by inversion of the signs of control signals for these switches. Further, the switches SW_sMUX and SWrMUX can be brought to an intermediate state between the on-state and the off-state as well as the on-state and the off-state. The intermediate state is a half-on state at a resistance lower than that of the off-state and higher than that of the on-state.

The sense circuit 10 includes the sense amplifiers SA. Each of the sense amplifiers SA includes a first input terminal sIN, a second input terminal rIN, and an output terminal OUT, and compares the voltage of the first input terminal sIN and the voltage of the second input terminal rIN with each other and amplifies the voltage difference therebetween to be output from the output terminal OUT. In the present embodiment, the first input terminal sIN receives a voltage based on data in the relevant selected memory cell MC1 and the second input terminal rIN receives a reference voltage between the data "0" and the data "1". The sense amplifier SA compares the voltage based on the data in the relevant selected memory cell MC1 with the reference voltage, amplifies the voltage difference therebetween, and outputs the voltage difference from the output terminal OUT. The logic "0" or "1" of the data is determined according to the level of the voltage difference from the output terminal OUT.

The sense amplifiers SA are provided to correspond to the bit lines BL, respectively. In the following descriptions, an array of a bit line BL and memory cells MC corresponding thereto is referred to also as "column". When a certain word line sWL is selected, the sense amplifiers SA of the respective columns detect data to be transmitted to a plurality of bit lines BL intersecting with the selected word line sWL, respectively. That is, a plurality of memory cells MC corresponding to intersection areas between the selected word line sWL and the bit lines BL are the selected memory cells MC1 and the sense amplifiers SA detect data stored in the selected memory cells MC1 of the relevant columns, respectively. In FIG. 2, one sense amplifier SA and a bit line (selected bit line) sBL of one column corresponding to the sense amplifier SA are illustrated and illustrations of the sense amplifiers SA and the like corresponding to other columns are omitted.

The first input terminal sIN of each of the sense amplifiers SA is connected to a drive line sBDRV via a third transistor SW_sSA and is connected to the selected bit line sBL via a first transistor SW_sMUX. The relevant selected memory cell MC1 is connected between the selected bit line sBL and the selected word line sWL. Accordingly, the first input terminal sIN of each of the sense amplifiers SA can be electrically connected to the selected memory cell MC1 at a time of reading data.

Meanwhile, the second input terminal rIN of each of the sense amplifiers SA is connected to a drive line rBDRV via the transistor SW_rSA to input the reference voltage. The drive line rBDRV is connected to the non-selected bit lines rBL via the relevant transistors SW_rMUX. The non-selected memory cells MC0 are connected between the non-selected bit lines rBL and the non-selected word lines rWL. The transistor SW_rMUX is in the off-state at a time of reading data in the selected memory cell MC1, and the drive line rBDRV and the second input terminal rIN attempt to keep a precharge voltage applied by the precharge circuit PRCH. The precharge voltage is transmitted to the second input terminal rIN and is used as the reference voltage. The sense amplifier SA compares the voltage of the first input terminal sIN with the reference voltage of the second input terminal rIN to detect the logic of data in the selected memory cell MC1.

The drive lines sBDRV and rBDRV are connected in common to the precharge circuit PRCH via the transistors SW_sPre and SW_rPre, respectively. The precharge circuit PRCH charges the selected bit line sBL, the drive lines sBDRV and rBDRV, and the input terminals sIN and rIN with the reference voltage before a data detection operation. During data detection, the precharge switches SW_sPre and SW_rPre are both brought to the off-state and the precharge circuit PRCH is electrically disconnected from the drive lines sBDRV and rBDRV to end precharging. The precharge circuit. PRCH may charge the drive line sBDRV and the drive line rBDRV with voltages different, from each other. Also in this case, the equalizing switch SW_EQ substantially equalizes the voltage of the drive line sBDRV and the voltage of the drive line rBDRV and thus the equalized voltage can be used as the reference voltage.

The equalizing switch SW_EQ is connected between the drive line sBDRV and the drive line rBDRV. The equalizing switch SW_EQ electrically connects the drive line sBDRV and the drive line rBDRV to each other to equalize the voltages before a data detection operation. During data detection, the equalizing switch SW_EQ is also brought to the off-state and the drive line sBDRV transmits a voltage according to the data in the selected memory cell MC1 to the sense amplifier SA.

The switch SW_sMUX being the first transistor is provided on the selected bit line sBL between the selected memory cell MC1 and the first input terminal sIN of the relevant sense amplifier SA, and electrically connects or disconnects between the selected bit line sBL and the drive line sBDRV.

The switch SW_sSA being the third transistor is connected between the switch SW_sMUX (or the drive line sBDRV) and the first input terminal sIN of the sense amplifier SA and can electrically connect or disconnect therebetween.

The switch SW_rMUX on the side of the second input terminal rIN is provided on the non-selected bit line rBL between the non-selected memory cells MC0 and the second input terminal rIN of the relevant sense amplifier SA, and electrically connects or disconnects between the non-selected bit line rBL and the drive line rBDRV.

The switch SW_rSA is connected between the switch SW_rMUX (or the drive line rBDRV) and the second input terminal rIN of the sense amplifier SA, and electrically connects or disconnects therebetween.

The controller CNT controls the constituent elements illustrated in FIG. 2. For example, the controller CNT controls ON/OFF of the switches SW_sMUX, SW_rMUX, SW_sSA, SW_rSA, SW_sPre, SW_rPre, and SW_EQ.

The voltage sources sPS and rPS are circuits provided to bring the switches SW_sMUX and SW_rMUX to the intermediate state, respectively. The voltage sources sPS and rPS bring the switches SW_sMUX and SW_rMUX to the intermediate state from when the voltage of the selected word line sWL is increased (a data read operation is started) until just before a data detection operation, so that leakage currents from the half-selected memory cells hMC flow toward the sense amplifier SA. Accordingly, the leakage currents from the half-selected memory cells hMC are eliminated via the drive line sBDRV. Because the precharge circuit PRCH keeps the drive line sBDRV at a predetermined reference voltage during a precharge period, the leakage currents are eliminated via the precharge circuit. PRCH. Configurations of the voltage sources sPS and rPS will be explained later with reference to FIG. 5.

The bit lines sBL and rBL and the drive lines sBDRV and rBDRV have parasitic capacitances C_sBL, C_rBL, C_sBDRV, and C_rBDRV, and voltages thereof change according to amounts of charges accumulated therein, respectively. In the present embodiment, the voltage according to the data in the selected memory cell MC1 is transmitted to the first input terminal sIN using the capacitances of the bit line sBL and the drive line sBDRV, and the reference voltage is transmitted to the second input terminal rIN using the capacitance of the drive line rBDRV. At the time of data detection, the bit lines sBL and rBL are electrically disconnected from the sense amplifier SA and the sense amplifier SA compares the voltage according to the data in the selected memory cell MC1 with the reference voltage for detection. In this way, the memory chip 1 according to the present embodiment reads data using a so-called open bit line method.

For example, it is assumed that the voltages of the non-selected bit lines rBL and the non-selected word lines rWL and uWL are a ground voltage (0 (zero) volt). In this case, almost no voltage difference is applied to the non-selected memory cells MC0 connected between the non-selected word lines and the non-selected bit lines. As described above, the second input terminal rIN is disconnected from the non-selected memory cells MC0 and keep the reference voltage at the time of reading data after being precharged.

It is assumed that the voltage of the selected bit line sBL is decreased to a negative voltage (−4 volts, for example) at the time of reading data and that the voltage of the selected word line sWL is increased to a positive voltage (+4 volts, for example) at the time of reading data. This applies a read voltage (8 volts, for example) to the selected memory cell MC1 and causes a read current according to the resistance state (data logic) of the selected memory cell MC1 to flow in the selected memory cell MC1. The voltage of the selected bit line sBL changes according to the read current flowing in the selected memory cell MC1. The sense amplifier SA can detect the logic of data in the selected memory cell MC1 by detecting a change of the voltage on the first input terminal sIN with respect to the reference voltage on the second input terminal rIN.

The selected bit line sBL is connected to a plurality of non-selected memory cells hMC as well as the selected memory cell MC1. The non-selected memory cells hMC being second memory cells are connected between the selected bit line sBL and a plurality of non-selected word lines uWL, and receive the voltage of the selected bit line sBL and the voltage of the non-selected word lines uWL. For example, when the voltage of the selected bit line sBL is decreased to a negative voltage (−4 volts, for example) at the time of reading data and the voltage of the non-selected word lines uWL is kept at, for example, 0 volt, a voltage (4 volts, for example) half of the read voltage is applied to the non-selected memory cells hMC.

Therefore, the non-selected memory cells hMC are in a half-selected state and receive a voltage difference larger than non-selected memory cells connected between non-selected word lines and non-selected bit lines. In the present specification, the non-selected memory cells hMC are referred to as "half-selected memory cells hMC" to be distinguished from non-selected memory cells connected between non-selected word lines and non-selected bit lines. While being smaller than a voltage difference applied to the selected memory cell MC1, a certain voltage difference is applied to the half-selected memory cells hMC. Therefore, a small leakage current sometimes flows in the half-selected memory cells hMC. This leakage current flows toward the sense amplifier SA and is accumulated in the selected bit line sBL, similarly to the read current flowing through the selected bit line sBL.

In this way, the selected bit line sBL is connected to one selected memory cell MC1 and other half-selected memory cells hMC. For example, when there are 2048 memory cells MC connected in common to one bit line BL, that is, when the number of memory cells in one column is 2048, the selected bit line sBL is connected to one selected memory cell MC1 and 2047 half-selected memory cells hMC.

If 0.1 nanoampere of current flows in each of the 2047 half-selected memory cells hMC, the total of the leakage currents from the half-selected memory cells hMC is about 0.2 microampere. When the period in which the voltage difference is applied to the half-selected memory cells hMC (the period of a read operation) is about 20 nanoseconds, this implies that about 4 femtofarads of charges flow in the selected bit line sBL as leakage currents. For example, when the capacitance C_sBL of the selected bit line sBL is 20 femtofarads, the selected bit line sBL increases by about 0.2 volt due to the leakage currents. When the voltage difference between data "1" and data "0" in the selected memory cell MC1 is 0.2 volt, there is a risk that the logic of data is inverted due to the leakage currents from the half-selected memory cells hMC. This prevents the sense circuit 10 from accurately detecting the data in the selected memory cell MC1.

According to the present embodiment, each of the voltage sources sPS brings the switch SW_sMUX to the intermediate state between the on-state and the off-state until just before a data detection operation after the voltage of the selected bit line sBL is decreased and the voltage of the selected word line sWL is increased. That is, the voltage source sPS brings the relevant switch SW_sMUX to the intermediate state from when the read voltage is applied, to the selected memory cell MC1 and a voltage difference for half selection is applied to the half-selected memory cells hMC until just before a data detection operation. Therefore, the switch SW_sMUX enables the leakage currents from the half-selected memory cells hMC to be eliminated from the selected bit line sBL. The leak currents can be eliminated to outside of the sense circuit 10 and the switch circuit 20 via the precharge circuit PRCH and the like. Due to elimination of the current corresponding to the leakage currents from the half-selected memory cells hMC from the selected bit line sBL, the read current flowing through the selected memory cell MC1 can be accumulated in the selected bit line sBL. Therefore, the voltage of the selected bit line sBL can become a voltage according to the data in the selected memory cell MC1.

Thereafter, at the time of data detection, the controller CNT switches the switch SW_sMUX from the intermediate state to the on-state to transmit the voltage of the selected bit line sBL to the sense amplifier SA. Accordingly, the sense amplifier SA can accurately detect the data in the selected memory cell MC1.

Figure 3:
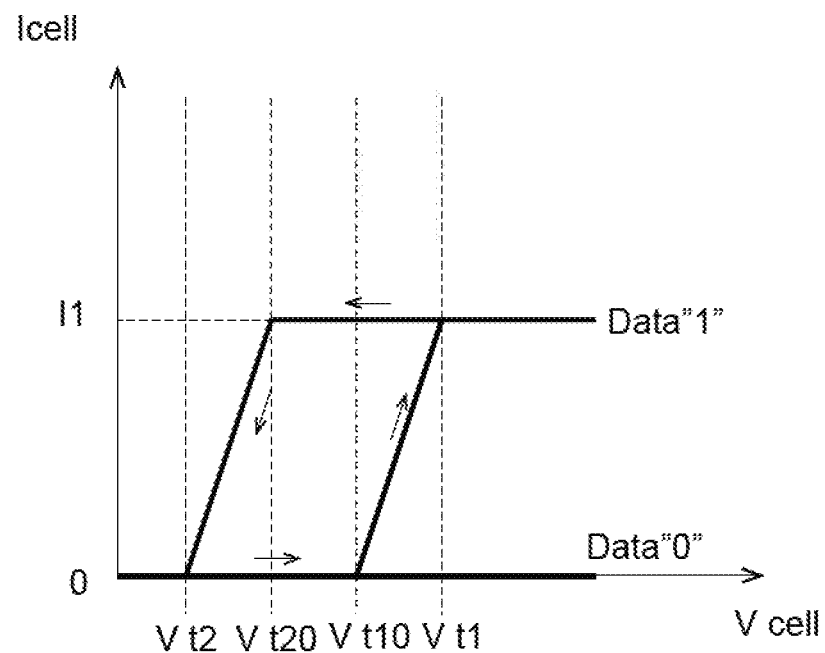
FIG. 3 is a graph illustrating voltage-current characteristics at the time of reading data in the selected memory cell.

FIG. 3 is a graph illustrating voltage-current characteristics at the time of reading data in the selected memory cell MC1. The selected memory cell MC1 is, for example, a PCM. The horizontal axis represents a cell voltage Vcell to be applied to the selected memory cell MC1, which is, for example, substantially equal to the voltage difference between the selected bit line sBL and the selected word line sWL. The vertical axis represents a cell current Icell flowing through the selected memory cell MC1.

In a case where the selected memory cell MC1 stores therein data "1" and when the cell voltage Vcell is increased from a ground voltage (0 volt, for example), the cell current Icell increases when the cell voltage Vcell exceeds a threshold voltage Vt10. The cell current Icell reaches a current I1 when the cell voltage Vcell exceeds a first voltage Vt1 higher than the threshold voltage Vt10. When the cell voltage Vcell is decreased after the cell voltage Vcell exceeds the first voltage Vt1, the cell current Icell keeps the current I1 until the cell voltage Vcell becomes a threshold voltage Vt20 lower than the threshold voltage Vt10, starts decreasing when the cell voltage Vcell becomes the threshold voltage Vt20, and decreases to almost zero when the cell voltage Vcell falls below a second voltage Vt2 lower than the threshold voltage Vt20. As described above, the memory cells MC have hysteresis in the current-voltage characteristics, and the threshold voltage Vt10 and the first voltage Vt1 where the cell current Icell increases and the threshold voltage Vt20 and the second voltage Vt2 where the cell current Icell decreases are different.

In a case of having such hysteresis, when the cell voltage Vcell is decreased after having increased to the first voltage Vt1, the selected memory cell MC1 passes the cell current Icell at voltages between the first voltage Vt1 and the second voltage Vt2.

On the other hand, in a case where the selected memory cell MC1 stores therein data "0", the cell current. Icell increases little even if the cell voltage Vcell is increased from a ground voltage (0 volt, for example). Therefore, not so large a current flows in the selected bit line sBL. Accordingly, the voltage of the selected bit line sBL becomes a voltage according to the logic of data stored in the selected memory cell MC1.

In this way, the selected memory cell MC1 allows the cell current Icell according to the data to flow when the cell voltage Vcell exceeds the first voltage Vt1, and sets back the cell current Icell when the cell voltage Vcell falls below the second voltage Vt2 lower than the first voltage Vt1.

The sense amplifier SA detects the logic of data stored in the selected memory cell MC1 on the basis of the voltage of the selected bit line sBL generated depending on an amount of the cell current Icell flowing while the cell voltage Vcell decreases from the first voltage Vt1 to the second voltage Vt2.

A data read operation of the memory chip 1 is explained next.

Figure 4:
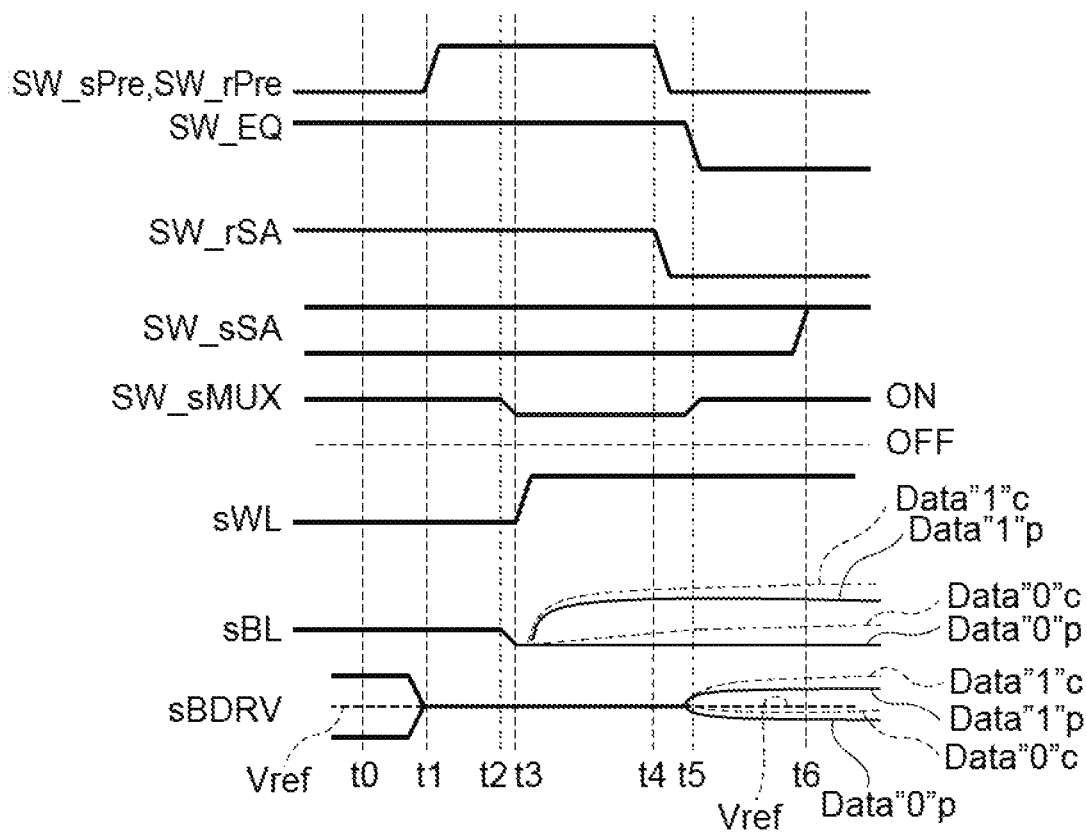
FIG. 4 is a timing chart illustrating an example of the data read operation.

FIG. 4 is a timing chart illustrating an example of the data read operation. The horizontal axis represents a time. The vertical axis represents a gate voltage or a line voltage.

At t0, the switches SW_sPre and SWrPre are in the off-state. Therefore, precharging has not been performed yet at this time. Meanwhile, the switch SW_EQ is in the on-state and the voltages of the drive lines sBDRV and rBDRV are equalized. The switch SW_rSA is in the on-state and electrically connects the drive line rBDRV and the second input terminal rIN to each other. The switch SW_sSA can be in either the on-state or the off-state at the time. The switch SW_sMUX is in the on-state and electrically connects the selected bit line sBL and the drive line sBDRV to each other. Accordingly, the selected bit line sBL, the drive lines sBDRV and rBDRV, and the second input terminal rIN are electrically connected and the voltages thereof are equalized. However, the selected bit line sBL, the drive lines sBDRV and rBDRV, and the second input terminal rIN have not been precharged at this time and the voltages thereof are in an unstable state. Therefore, the voltage of the drive line sBDRV is unstable as illustrated in FIG. 4.

Next, at t1, the precharge switches SW_sPre and SW_rPre are brought to the on-state. Accordingly, the selected bit line sBL, the drive lines sBDRV and rBDRV, and the second input terminal rIN having the voltage equalized are charged with a predetermined reference voltage Vref.

Next, at t2, the switch SW_sMUX is brought to the intermediate state. The bit line controller BLC decreases the voltage of the selected bit line sBL from the ground voltage. For example, the bit line controller BLC decreases the voltage of the selected bit line sBL from the ground voltage (0 volt, for example) to a negative voltage (−4 volts, for example).

Subsequently, at t3, the word line controller WLC increases the voltage of the selected word line sWL from the ground voltage (0 volt, for example) to a positive voltage (+4 volts, for example). Accordingly, a read voltage (8 volts, for example) is applied to the selected memory cell MC1 and a current flows through the selected memory cell MC1. Therefore, a current according to the data in the selected memory cell MC1 flows in the selected bit line sBL and the voltage of the selected bit line sBL changes.

At this time, as described above, the leakage currents from the half-selected memory cells hMC flow in the selected bit line sBL along with the read current of the selected memory cell MC1. In the present embodiment, the switch SW_sMUX is in the intermediate state and a current corresponding to the leakage currents from the half-selected memory cells hMC flows from the selected bit line sBL to the drive line sBDRV. Therefore, the selected bit line sBL that transmits data "0" is kept substantially at a negative voltage (−4 volts, for example) and the selected bit line sBL that transmits data "1" approaches a positive voltage (+4 volts, for example), as indicated by a solid line Data"0"p or Data"1"p of the selected bit line sBL in FIG. 4. Because the drive line sBDRV is connected to the precharge circuit PRCH at this time, the leakage currents are eliminated to the precharge circuit PRCH and the drive line sBDRV is kept at the reference voltage Vref.

If the switch SW_sMUX is in the off-state, the current corresponding to the leakage currents from the half-selected memory cells hMC does not flow from the selected bit line sBL to the drive line sBDRV and is kept accumulated in the selected bit line sBL. Therefore, the selected bit line sBL that transmits data "0" increases from almost the negative voltage (−4 volts, for example) according to the leakage currents to approach the reference voltage Vref as indicated by a broken line Data"0"c of the selected bit line sBL in FIG. 4. The selected bit line sBL that transmits data "1" further increases from the positive voltage (+4 volts, for example) according to the leakage currents as indicated by a broken line Data"1"c.

Next, at t4, the switches SW_sPre and SW_rPre are brought to the off-state and the precharging operation by the precharge circuit PRCH ends. Along therewith, the switch SW_rSA is brought to the off-state and the second input terminal rIN is electrically disconnected from the drive line rBDRV. Accordingly, the second input terminal rIN is kept at the reference voltage Vref.

Next, at t5, the switch SW_EQ is brought to the off-state and the controller CNT brings the switch SW_sMUX from the intermediate state to the on-state. Due to the off-state of the switch SW_EQ, the drive line sBDRV is electrically disconnected from the drive line rBDRV and the capacitance of the drive line sBDRV is reduced (is decreased). Accordingly, the voltage of the selected bit line sBL is more easily transmitted to the drive line sBDRV. Further, due to the on-state of the switch SW_sMUX, the selected bit line sBL is electrically connected to the drive line sBDRV with a low resistance and the voltage of the selected bit line sBL is transmitted to the drive line sBDRV. That is, the solid line Data"0"p of the selected bit line sBL in FIG. 4 appears like a solid line Data"0"p of the drive line sBDRV, and the solid line Data"1"p of the selected bit line sBL appears like a solid line Data"1"p of the drive line sBDRV. The solid lines Data"0"p and Data"1"p of the drive line sBDRV are subjected to less influences of the leakage currents from the half-selected memory cells hMC and the sense amplifier SA can accurately detect the logic of data through a comparison with the reference voltage Vref.

Meanwhile, if the switch SW_sMUX is in the off-state from t3 to t4, the broken line Data"0"c of the selected bit line sBL in FIG. 4 appears like a broken line Data"0"c of the drive line sBDRV and the broken line Data"1"c of the selected bit line sBL appears like a broken line Data"1"c of the drive line sBDRV when the switch SW_sMUX is brought to the on-state at t5. The broken lines Data"0"c and Data"1"c of the drive line sBDRV are greatly influenced by the leakage currents from the half-selected memory cells hMC. Therefore, the voltage level of the data "0" approaches the reference voltage Vref. In this case, there is a risk that the sense amplifier SA erroneously detects the logic of the data "0".

Next, at t6, the switch SW_sSA is brought to the on-state and the first input terminal sIN is electrically connected to the drive line sBDRV. Accordingly, a voltage (read voltage) corresponding to read data developed in the drive line sBDRV is transmitted to the first input terminal sIN. The sense amplifier SA compares the read voltage on the first input terminal sIN with the reference voltage Vref on the second input terminal rIN and amplifies the voltage difference therebetween to be output from the output terminal OUT. This enables the logic of data stored in the selected memory cell MC1 to be read.

According to the present embodiment, each of the voltage sources sPS brings the relevant switch SW_sMUX to the intermediate state from when a read voltage is applied to the selected memory cell MC1 until when data is developed in the drive line sBDRV (that is, from t3 to t5). Accordingly, the switch SW_sMUX enables a current corresponding to the leakage currents from the half-selected memory cells hMC to be eliminated from the selected bit line sBL. As a result, the voltage of the selected bit line sBL becomes a voltage according to the data in the selected memory cell MC1 and the sense amplifier SA can accurately detect the logic of data in the selected memory cell MC1.

A current. Imux is a current flowing between the source and the drain of the switch SW_sMUX. The current Imux can include the leakage currents from the half-selected memory cells hMC and a part of the read current from the selected memory cell MC1. In this case, to eliminate a current larger than the leakage currents from the selected bit line sBL, rising of Data"1"p is slightly delayed in the selected bit line sBL. However, the voltage of the selected bit line sBL finally reaches Data"1"p. Further, Data"0"p does not rise because the leakage currents have been eliminated. Therefore, it may be necessary to slightly delay the timing of a start of the data detection at t5. However, the voltage of the drive line sBDRV eventually becomes Data"1"p or Data"0"p and thus the sense amplifier SA can accurately detect data in the selected memory cell MC1. Of course, in order to accumulate the current from the selected memory cell MC1 in the selected bit line sBL, the current Imux needs to be smaller than a total current of the leakage currents from the half-selected memory cells hMC and the read current from the selected memory cell MC1.

In the above explanations, the sense amplifier SA inputs the reference voltage to the second input terminal rIN and detects the logic of read data input to the first input terminal sIN. Conversely, the sense amplifier SA may input the reference voltage to the first input terminal sIN and detect the logic of read data input to the second input terminal rIN. In this case, it suffices to switch between the operations of the switches (SW_sMUX and SW_sSA) on the right side of the sense amplifier SA in FIG. 2 and the operations of the switches (SW_rMUX and SW_rSA) on the left side thereof. In this case, rBL is a selected bit line and rWL is a selected word line. The memory cell MC0 is a selected memory cell.

(Configuration of Voltage Source sPS)

The configuration of the voltage source sPS is explained next. The configuration of the voltage source rPS can be fundamentally same as that of the voltage source sPS and explanations thereof are omitted here.

Figure 5:
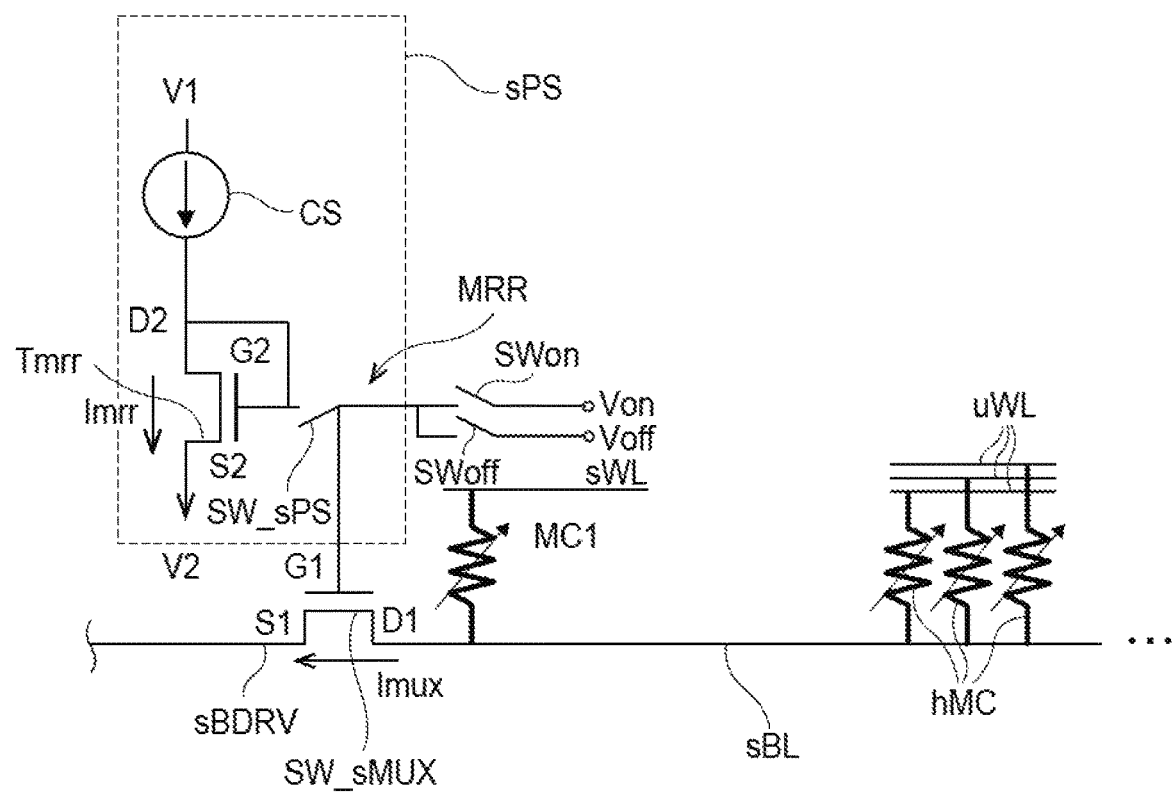
FIG. 5 is a diagram illustrating an example of the configuration of the voltage source and a peripheral configuration.

FIG. 5 is a diagram illustrating an example of the configuration of the voltage source sPS and a peripheral configuration. The voltage source sPS includes a mirror transistor Tmrr, a current source CS, and a switch SW_sPS and generates a gate voltage of the switch SW_sMUX. The switch SW_sMUX is an N-type MOSFET. A current mirror circuit MRR is constituted by the switch SW_sMUX, the mirror transistor Tmrr, and the current source CS. The switch SW_sPS is constituted by, for example, an N-type MOSFET.

A drain D2 and a gate G2 of the mirror transistor Tmrr being a second transistor are connected to the current source CS. A source S2 of the mirror transistor Tmrr is connected to a low-voltage source V2. The current source CS is a constant current source that enables a current Imrr to flow. One end of the current source CS is connected to a high-voltage source V1. The other end of the current source CS is connected to the low-voltage source V2 via the mirror transistor Tmrr. The gate G2 of the mirror transistor Tmrr is connected to a gate G1 of the switch SW_sMUX via the switch SW_sPS. Accordingly, when the switch SW_sPS is in the on-state, the current ImUX corresponding to the current Imrr that flows in the mirror transistor Tmrr flows through the switch SW_sMUX.

A switch SWon being a first power-supply switch is connected between the gate G1 of the switch SW_sMUX and an on-voltage source Von and can apply an on-voltage to the gate G1. A switch SWoff being a second power-supply switch is connected between the gate G1 of the switch SW_sMUX and an off-voltage source Voff and can apply an off-voltage to the gate G1. For example, the on-voltage source Von is a high-level voltage source and the off-voltage source Voff is a low-level voltage source. In this case, the switches SWon and SWoff are preferably, for example, a P-type MOSFET and an N-type MOSFET, respectively. The conductivity types of MOSFETs for the switches SW_sPS, SWon, and SWoff are not particularly limited.

The switches SW_sPS, SWon, and SWoff are controlled by the controller CNT in FIG. 2. For example, only one of the switches SW_sPS, SWon, and SWoff is selectively brought to the on-state and remaining two switches keep the off-state. More specifically, when the switch SW_sMUX is to be brought to the intermediate state, the switch SW_sPS is brought to the on-state and the switches SWon and SWoff are brought to the off-state. When the switch SW_sMUX is to be brought to the on-state, the switch SWon is brought to the on-state and the switches SW_sPS and SWoff are brought to the off-state. When the switch SW_sMUX is to be brought to the off-state, the switch SWoff is brought to the on-state and the switches SW_sPS and SWon are brought to the off-state. In this way, the switch SW_sMUX can be brought to any of the intermediate state, the on-state, and the off-state.

A case where the switch SW_sPS is brought to the on-state and the current mirror circuit MRR brings the switch SW_sMUX to the intermediate state is explained in detail below.

The current Imux is obtained by multiplying the current Imrr by a ratio Smux/Smrr (hereinafter, also "mirror ratio Rmrr") between a size (gate width/gate length) Smrr of the mirror transistor Tmrr and a size (gate width/gate length) Smux of the switch SW_sMUX. That is, Imux can be represented by an expression 1.

$$Imux = Rmrr \times Imrr \qquad \text{(expression 1)}$$

In order to cause the switch SW_sMUX to pass a current equal to the leakage currents from the half-selected memory cells hMC as the current Imux, it suffices to set Rmrr×Imrr to be equal to the leakage currents on the basis of the expression 1. When the current Imux includes the leakage currents from the half-selected memory cells hMC and a part of the read current from the selected memory cell MC1, it suffices to set Rmrr×Imrr to be equal to the total current of the leakage currents and the part of the read current. The following explanations are continued assuming that the current Imux is set to be equal to the leakage currents for the sake of convenience.

For example, when the size of the mirror transistor Tmrr and the size of the switch SW_sMUX are substantially equal (that is, when the mirror ratio Rmrr is about 1), the current Imux of the switch SW_sMUX is substantially equal to the current Imrr of the mirror transistor Tmrr. In this case, when the current source CS causes a current same as the leakage currents from the half-selected memory cells hMC to flow in the mirror transistor Tmrr as the current Imrr, the current Imux substantially same as the leakage currents flows in the switch SW_sMUX. Accordingly, the switch SW_sMUX enables a substantially same current as the leakage currents to flow from the selected bit line sBL to the drive line sBDRV. When the current substantially same as the leakage currents is eliminated from the selected bit line sBL, the selected bit line sBL can substantially accurately accumulate the read current flowing in the selected memory cell MC1 and can retain a voltage according to the data in the selected memory cell MC1.

For example, when the size of the switch SW_sMUX is n times (n is a positive number) as large as the size of the mirror transistor Tmrr (when the mirror ratio Rmrr is about n), the current Imux of the switch SW_sMUX is n times as large as the current Imrr of the mirror transistor Tmrr (n×Imrr). In this case, to obtain the current Imux substantially same as the leakage currents, it suffices that the current source CS causes a current which is one-nth of the leakage currents to flow in the mirror transistor Tmrr as the current Imrr. Accordingly, the switch SW_sMUX enables a substantially same current as the leakage currents to flow from the selected bit line sBL to the drive line sBDRV. As a result, the selected bit line sBL can substantially accurately accumulate the read current flowing in the selected memory cell MC1 and can retain the voltage according to the data in the selected memory cell MC1.

Figure 6:
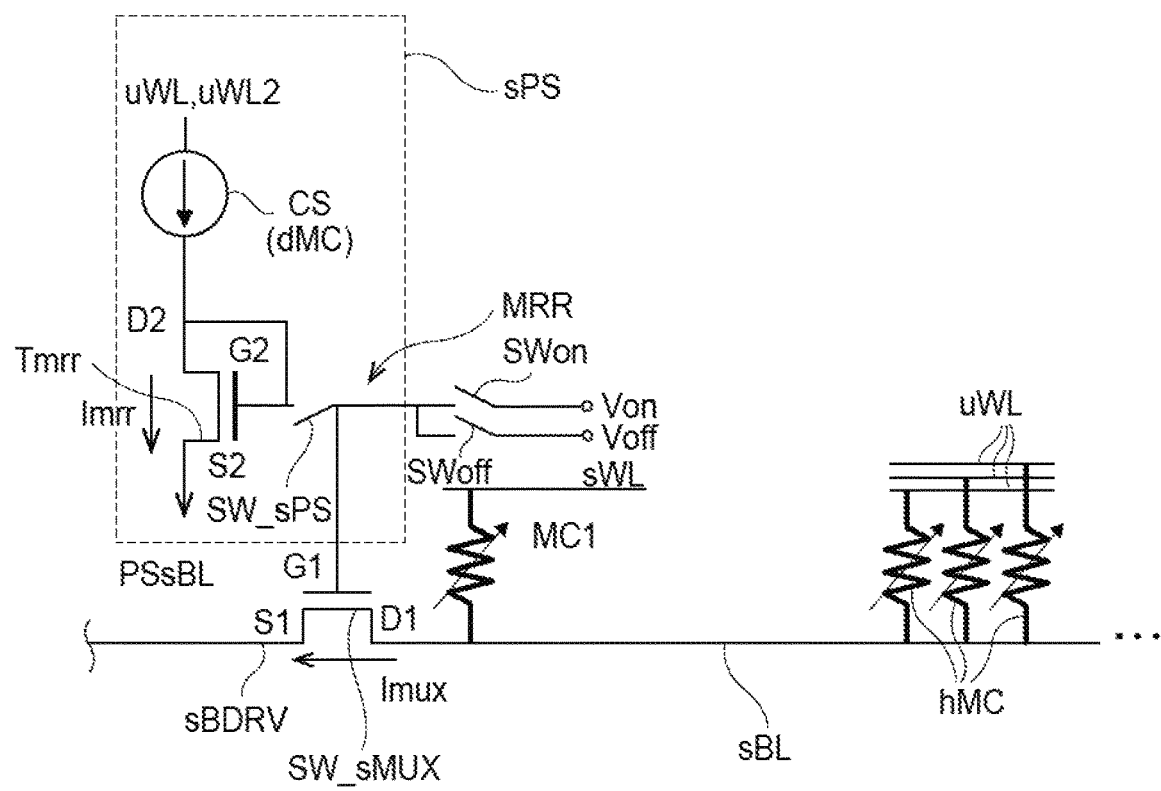
FIG. 6 is a diagram illustrating a more detailed configuration example of the current mirror circuit using the voltage source in FIG. 5.

FIG. 6 is a diagram illustrating a more detailed configuration example of the current mirror circuit MRR using the voltage source sPS in FIG. 5. In this example, a dummy cell dMC is used as the current source CS. A dummy cell dMC is a memory cell MC of a non-selected column not including the selected memory cell MC1. Therefore, the dummy cell dMC can be a general memory cell MC that is connected to any non-selected bit line and that is used to store data therein, or can be a memory cell that has the same configuration as the memory cells MC but that is not used to store data therein. The voltage of the non-selected word lines uWL and rWL is used as the high-voltage source V1 and the voltage of the selected bit line sBL is used as the low-voltage source V2.

The mirror transistor Tmrr is provided between a non-selected word line uWL or a third line uWL2 having a voltage substantially same as that of the non-selected word line uWL (hereinafter, also "non-selected word line uWL or uWL2") and a fourth line PSsBL (hereinafter, also "line PSsBL") having a voltage substantially same as that of the selected bit line sBL. More specifically, the drain D2 and the gate G2 of the mirror transistor Tmrr are connected to the non-selected word line uWL or uWL2 via the dummy cell dMC and are also connected to the gate G1 of the switch SW_sMUX. The source S2 of the mirror transistor Tmrr is connected to the line PSsBL. While being set to a voltage substantially same as that of the non-selected word line uWL, the third line uWL2 is a line different from the non-selected word line uWL. While being set to a substantially same voltage as that of the selected bit line sBL, the fourth line PSsBL is a line different from the selected bit line sBL and is, for example, a power-supply line at a substantially same voltage as that of the selected bit line sBL.

Figure 7:
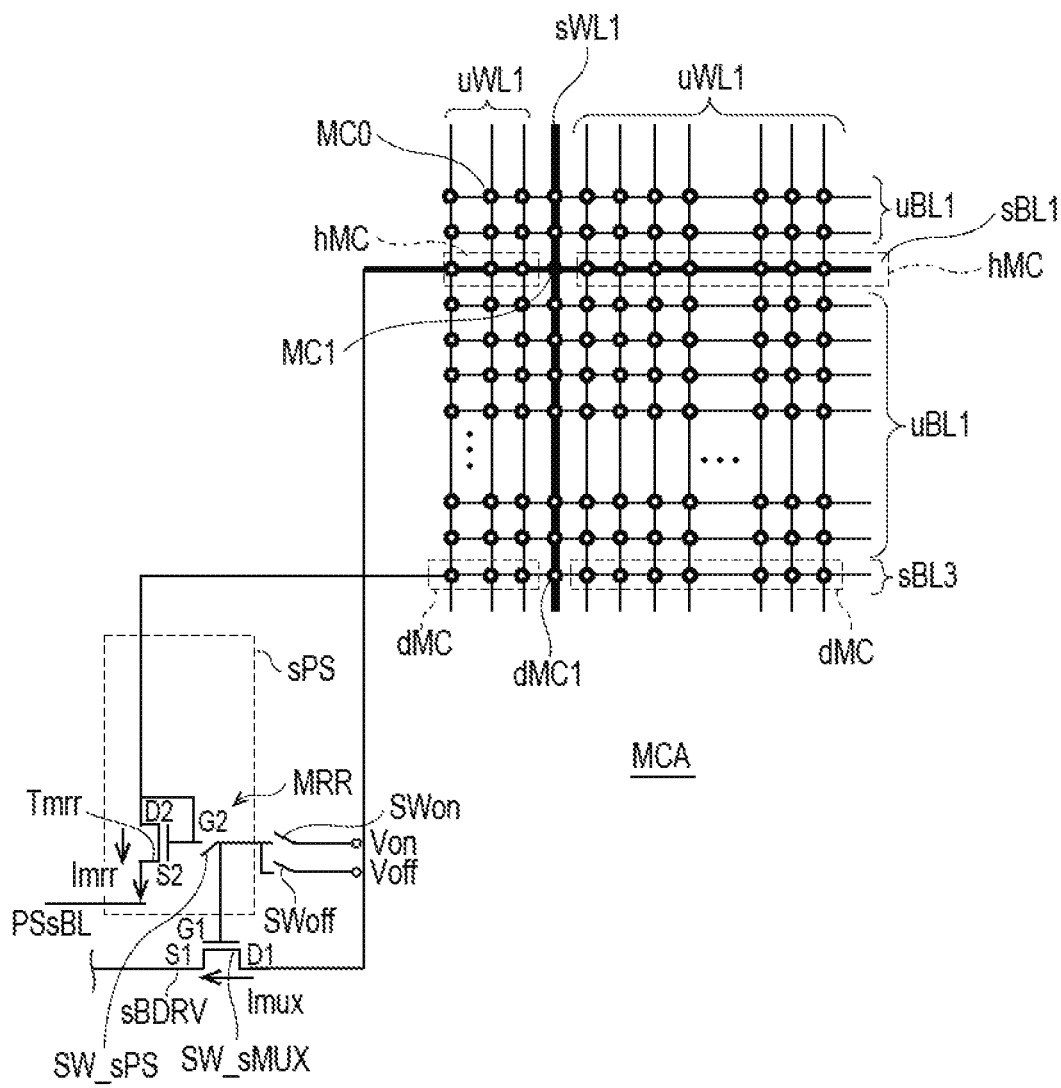
FIG. 7 is a schematic diagram illustrating an example of the connection relation between the current mirror circuit and the memory cell array.

FIG. 7 is a schematic diagram illustrating an example of the connection relation between the current mirror circuit MRR and the memory cell array MCA. A case where the switch SW_sPS is brought to the on-state and the current mirror circuit MRR brings the switch SW_sMUX to the intermediate state is explained below and explanations of the on-state and off-state of the switch SW_sMUX are omitted.

In this example, in order to detect data in the selected memory cell MC1 in the memory cell array MCA, a dummy cell dMC connected to another bit line sBL3 and a non-selected word line uWL1 in the same memory cell array MCA is used as the current source CS. While being arranged in a different column from that of a selected bit line sBL1, the bit line sBL3 is set to a substantially same voltage as that of the selected bit line sBL1. Therefore, the dummy cell dMC connected to the bit line sBL3 and the non-selected word line uWL1 passes leakage currents similarly to the half-selected memory cells hMC. A dummy cell dMC1 connected to the bit line sBL3 and the selected word line sWL1 is in a high-resistance state (a reset state). Accordingly, almost no current flows through the dummy cell dMC1 and the leakage current from the dummy cell dMC mainly flows through the bit line sBL3. The current in the bit line sBL3 is the current Imrr.

As described above, the dummy cell dMC serving as the current source CS is a constant current source that causes the current Imrr to flow. The dummy cell dMC is provided between the non-selected word line uWL1 and the selected bit line sBL3 and is connected in series to the mirror transistor Tmrr. More specifically, one end of the dummy cell dMC is connected to the selected bit line sBL3. The other end of the dummy cell dMC is connected to the non-selected word line uWL1.

When, being a memory cell that is not used to store therein data, the dummy cell dMC is sometimes provided at an end of the memory cell array. MCA. There is a case where the current source CS includes a plurality of dummy cells dMC. In this case, the dummy cells dMC are connected in parallel to each other and are connected in series to the mirror transistor Tmrr.

In the present embodiment, the line PSsBL is a power-supply line at a substantially same voltage as that of the selected bit line sBL1. The source S2 of the mirror transistor Tmrr is connected to the power-supply line PSsBL and receives a substantially same voltage as that of the selected bit line sBL1.

When the mirror transistor Tmrr is in the on-state, the dummy cells dMC are connected between the non-selected word lines uWL and the bit line sBL3 and are in a half-selected state similarly to the half-selected memory cells hMC. Therefore, in this case, the dummy cells dMC pass leakage currents substantially same as those of the half-selected memory cells hMC. The current Imrr can be set depending on the number of the dummy cells dMC connected in parallel to each other.

As described above, in order to cause the current Imux to be substantially equal to the leakage currents from the half-selected memory cells hMC, it suffices to set Rmrr× Imrr to be equal to the leakage currents from the half-selected memory cells hMC on the basis of the expression 1. Therefore, the number of dummy cells dMC connected in parallel to each other is set to obtain a desired current Imrr on the basis of the mirror ratio Rmrr. Accordingly, the current Imux can be set to be substantially equal to the leakage currents from the half-selected memory cells hMC.

For example, when the mirror ratio Rmrr is about 1, the current Imux of the switch SW_sMUX is substantially equal to the current Imrr of the mirror transistor Tmrr. It suffices that the current source CS passes a same current as the leakage currents from the half-selected memory cells hMC as the current Imrr. In this case, it suffices to set the number of dummy cells dMC connected in parallel to each other to be equal to the number of the half-selected memory cells hMC connected to the selected bit line sBL. Accordingly, the switch SW_sMUX enables a substantially same current as the leakage currents to flow from the selected bit line sBL to the drive line sBDRV as the current Imux. In this way, the mirror transistor Tmrr can bring the switch SW_sMUX to the intermediate state.

In order to generalize, when the mirror ratio Rmrr is about n, the current Imux of the switch SW_sMUX is n times as large as the current. Imrr of the mirror transistor Tmrr (n×Imrr). In this case, to obtain the current Imux substantially same as the leakage currents, it suffices that the current source CS causes a current which is one-nth of the leakage currents to flow in the mirror transistor Tmrr as the current Imrr. Therefore, it suffices to set the number of dummy cells dMC connected in parallel to each other to be equal to one-nth of the number of the half-selected memory cells hMC connected to the selected bit line sBL. Accordingly, the switch SW_sMUX enables a substantially equal current to the leakage currents to flow from the selected bit line sBL to the drive line sBDRV as the current Imux. In this way, the mirror transistor Tmrr can bring the switch SW_sMUX to the intermediate state.

As a general operation, the controller CNT initially brings the switch SWon to the on-state and brings the switches SW_sPS and SWoff to the off-state to bring the switch SW_sMUX to the on-state (t0 to t2 in FIG. 4). The controller CNT thereafter brings the switch SWoff to the off-state and drives the current mirror circuit MRR to bring the switch SW_sMUX to the intermediate state (t3 to t5). The controller CNT then brings the switch SWon to the off-state to bring the switch SW_sMUX to the on-state (t5 to t6).

Accordingly, the selected bit line sBL can substantially accurately accumulate the read current flowing in the selected memory cell MC1 and can retain the voltage according to the data in the selected memory cell MC1. After a series of read operations ends, the controller CNT brings the switch SWoff to the on-state and brings the switches SW_sPS and SWon to the off-state to bring the switch SW_sMUX to the off-state.

Figure 8:
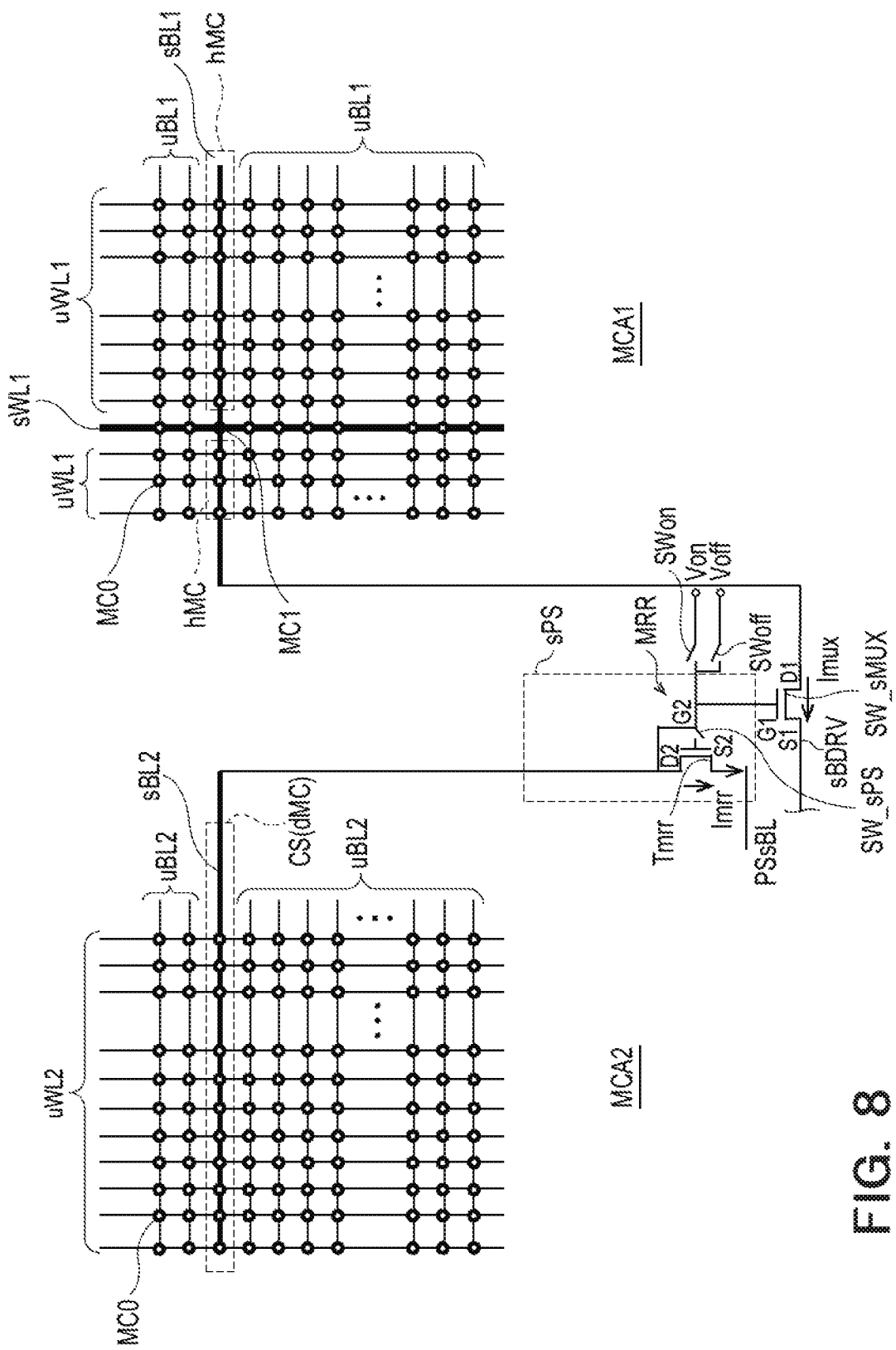
FIG. 8 is a schematic diagram illustrating another example of the connection relation between the current mirror circuit and the memory cell array.

FIG. 8 is a schematic diagram illustrating another example of the connection relation between the current mirror circuit MRR and the memory cell array MCA. A case where the switch SW_sPS is brought to the on-state and the current mirror circuit MRR brings the switch SW_sMUX to the intermediate state is explained below and explanations of the on-state and off-state of the switch SW_sMUX are omitted.

In this example, to detect the data in the selected memory cell MC1 in a first memory cell array MCA1, dummy cells dMC connected to a selected bit line sBL2 and non-selected word lines uWL2 arranged in a second memory cell array MCA2 different from the first memory cell array MCA1 are used as the current source Cs.

In order to distinguish the memory cell arrays MCA1 and MCA2 from each other, a selected word line, a selected bit line, non-selected word lines, and non-selected bit lines arranged in the first memory cell array MCA1 are denoted by sWL1, sBL1, uWL1, and uBL1, respectively, for the sake of convenience. A bit line at a substantially same voltage as that of the selected bit line, word lines at a substantially same voltage as that of the non-selected word lines, and bit lines at a substantially same voltage as that of the non-selected bit lines in the second memory cell array MCA2 are denoted by sBL2, uWL2, and uBL2, respectively.

The bit line sBL2, the word lines uWL2, and the bit lines uBL2 in the second memory cell array MCA2 have substantially same voltages as those of the selected bit line sBL1, the non-selected word lines uWL1, and the non-selected bit lines uBL1 in the first memory cell array MCA1, respectively.

The memory cell arrays MCA1 and MCA2 are provided in the same memory chip 1 so that the dummy cells dMC and the half-selected memory cells hMC have substantially equal configurations. For example, the memory cell arrays MCA1 and MCA2 are arrays arranged next to each other in the memory chip 1, and the voltage sources sPS and the sense amplifiers SA are placed between the memory cell array MCA1 and the memory cell array MCA2. This can suppress variation such as process variation in the memory cell arrays MCA1 and MCA2. The distance between the voltage sources sPS and the sense amplifiers SA, and the memory cell array MCA1, MCA2 can be shortened to shorten lines (not illustrated) connecting these units.

In the memory cell array MCA1, the selected memory cell MC1 is a memory cell connected to the selected bit line sBL1 and the selected word line sWL1. The half-selected memory cells hMC are memory cells connected to the selected bit line sBL1 and the non-selected word lines uWL1, respectively. Other memory cells are the non-selected memory cells MC0. For example, it is assumed that one column includes 2048 memory cells MC. In this case, one memory cell among 2048 memory cells is the selected memory cell MC1 and remaining 2047 memory cells are the half-selected memory cells hMC.

In the memory cell array MCA2, the dummy cells dMC are memory cells connected to the word lines uWL2 at a substantially same voltage as that of the non-selected word lines uWL1 and the bit line sBL2 at a substantially same voltage as that of the selected bit line sBL1. When all the word lines uWL2 are at substantially the same voltage as that of the non-selected word lines uWL1 in the memory cell array MCA1, 2048 memory cells MC in one selected column are the dummy cells dMC. Therefore, the number of the dummy cells dMC is substantially equal to the number of the half-selected memory cells hMC. The dummy cells dMC are connected between the word lines uWL2 at substantially the same voltage as that of the non-selected word lines uWL1 and the bit line sBL2 at substantially the same voltage as that of the selected bit line sBL, similarly to the half-selected memory cells hMC. Therefore, the current Imrr is substantially equal to the leakage currents from the half-selected memory cells hMC. Accordingly, it suffices that the mirror ratio Rmrr is set to 1 and the switch SW_sMUX causes a current substantially equal to the current Imrr to flow as the current Imux. The controller CNT thereafter brings the switch SWon to the on-state and the switch SW_sMUX from the intermediate state to the on-state. As a result, the selected bit line sBL1 can substantially accurately accumulate the read current flowing in the selected memory cell MC1 and can retain the voltage according to the data in the selected memory cell MC1.

The current mirror circuit MRR is constituted by the dummy cells dMC having a substantially same configuration as that of the half-selected memory cells hMC, and the half-selected memory cells hMC and the dummy cells dMC are arranged in the same memory chip 1. This suppresses variation such as process variation between the half-selected memory cells hMC and the dummy cells dMC and the switch SW_sMUX can more accurately pass the leakage currents.

Figure 9:
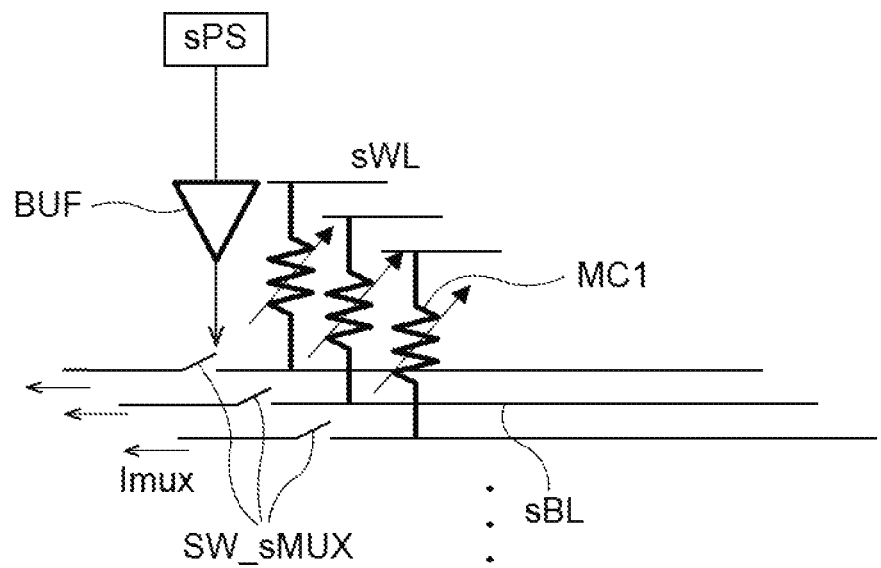
FIG. 9 is a configuration diagram of a voltage source provided in common to the switches.

FIG. 9 is a configuration diagram of a voltage source sPS provided in common to the switches SW_sMUX. As illustrated in FIG. 9, one voltage source sPS may be provided in common to the switches SW_sMUX. Also with this configuration, the switches SW_sMUX each can receive a predetermined voltage from the voltage source sPS and pass the current Imux according to the current Imrr therethrough. Provision of one voltage source sPS in common to the switches SW_sMUX can suppress increase in the area of the memory chip 1. Of course, when there is no need to consider increase in the area of the memory chip 1, the voltage sources sPS as many as the switches SW_sMUX may be provided to correspond to the switches SW_sMUX, respectively. Each of the voltage sources sPS may be provided to correspond to a plurality of memory cell arrays or may be provided to correspond to a unit for the read operation, such as a bank. One voltage source sPS may be provided to the memory chip 1.

When the line distance between the voltage source sPS and the switches SW_sMUX is long, a buffer BUF may be provided on a line between the voltage source sPS and the switches SW_sMUX as illustrated in FIG. 9. The buffer BUF can suppress attenuation of the output voltage from the voltage source sPS and can enhance noise resistance.

As described above, the memory chip 1 according to the present embodiment brings the switches SW_sMUX to the intermediate state and eliminates the leakage currents from the half-selected memory cells hMC from the selected bit line sBL while a read voltage is applied to the selected memory cell MC1. When data is thereafter to be detected by the sense circuit 10, the switches SW_sMUX are brought from the intermediate state to the on-state and the selected bit line sBL is connected to the drive line sBDRV to transmit the voltage of the selected bit line sBL to the drive line sBDRV on the side of the sense circuit 10. At this time, because the leakage currents from the half-selected memory cells hMC have been eliminated from the selected bit line sBL, the current according to data in the selected memory cell MC1 has been accumulated in the selected bit line sBL and the voltage according to the data can be accurately transmitted to the sense circuit 10. As a result, the sense circuit 10 can accurately detect the data stored in the selected memory cell MC1.

Furthermore, according to the present embodiment, memory cells (PCMs, for example) having the hysteresis characteristics as illustrated in FIG. 3 are used. In this case, the cell current. Icell differing according to the logic of data flows during a period in which the cell voltage Vcell decreases from the first voltage Vt1 to the second voltage Vt2. Therefore, the sense circuit 10 can detect the data by detecting the voltage according to a difference in the amount of charges accumulated in the selected bit line sBL.

(First Modification)

Figure 10:
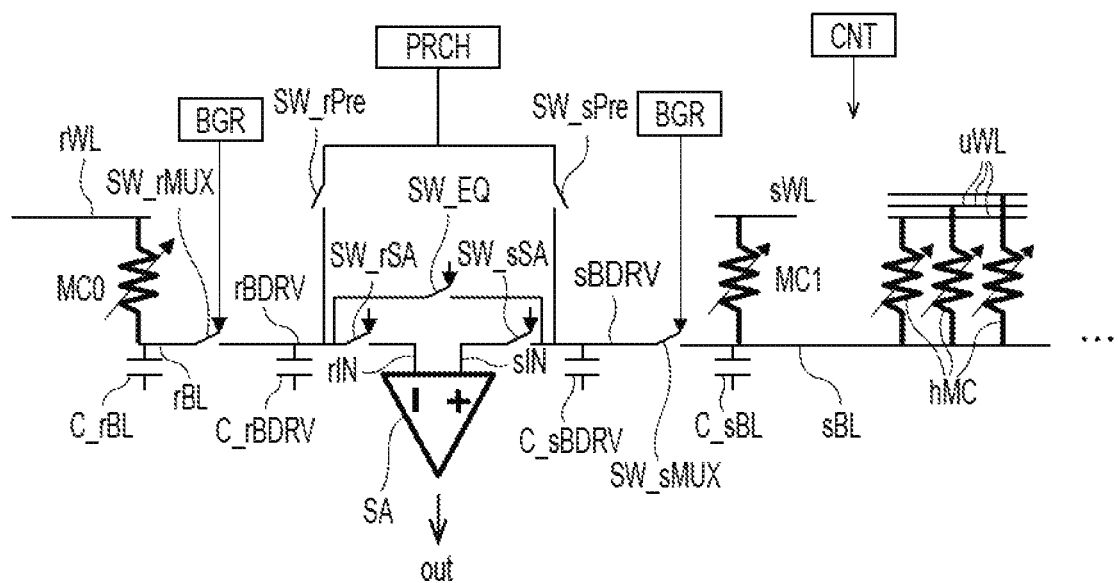
FIG. 10 is a diagram illustrating a configuration example according to a first modification.

FIG. 10 is a diagram illustrating a configuration example according to a first modification. In the above embodiment, the voltage source sPS is constituted by the current mirror circuit MRR. In contrast thereto, the voltage source sPS may be the BGR circuit described above. The BGR circuit outputs a constant voltage to the gate of the relevant switch S_W sMUX regardless of temperatures or power-supply voltages. In this case, the leakage currents from the half-selected memory cells hMC are previously measured and the output voltage of the BGR circuit is adjusted to enable the switch SW_sMUX to pass a substantially equal current to the leakage currents as the current Imux. In this manner, even when the BGR circuit is used instead of the current mirror circuit MRR as the voltage source sPS, the effects of the present embodiment are not lost.

Furthermore, the voltage source sPS may be a current source having identical temperature characteristics to those of the memory cells MC. Accordingly, the switch SW_sMUX can pass a current closer to the leakage currents from the half-selected memory cells hMC as the current Imux.

(Second Modification)

Figure 11:
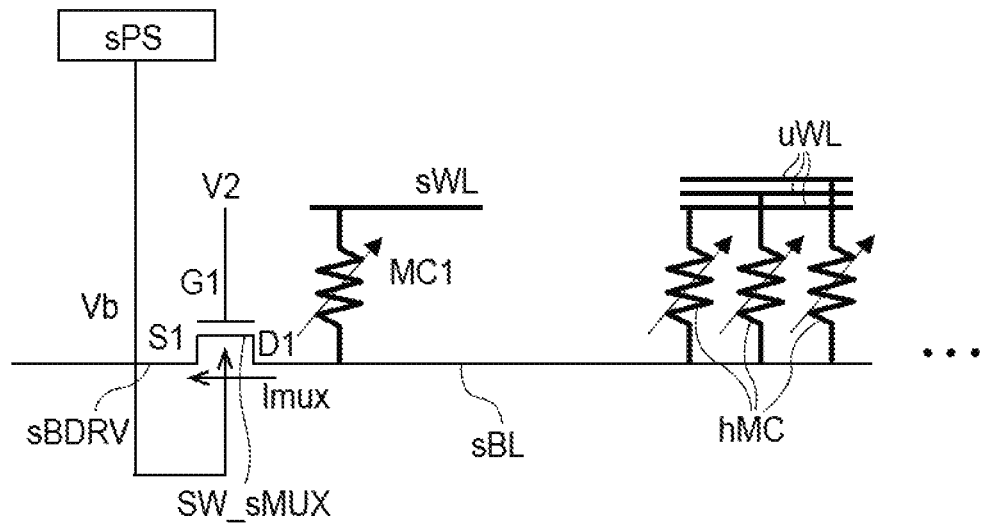
FIG. 11 is a diagram illustrating a configuration example according to a second modification.

FIG. 11 is a diagram illustrating a configuration example according to a second modification. In the above embodiment, the voltage source sPS applies a voltage to the gate of the relevant switch SW_sMUX. In contrast thereto, in the second modification, the voltage source sPS applies a voltage Vb (a substrate voltage or a back bias) to a body side (a substrate side) of the switch SW_sMUX. In this case, the gate of the switch SW_sMUX is connected to the low-voltage source V2. The substrate voltage Vb is a voltage higher than that of the low-voltage source V2. Due to application of the substrate voltage Vb, the threshold voltage of the switch SW_sMUX is decreased and the threshold voltage becomes, for example, 0 volt. Accordingly, even when the gate voltage is the voltage of the low-voltage source V2, the switch SW_sMUX can be brought to the intermediate state or the on-state. In this way, the voltage source sPS may control the switch SW_sMUX with the substrate voltage Vb.

(Third Modification)

Figure 12:
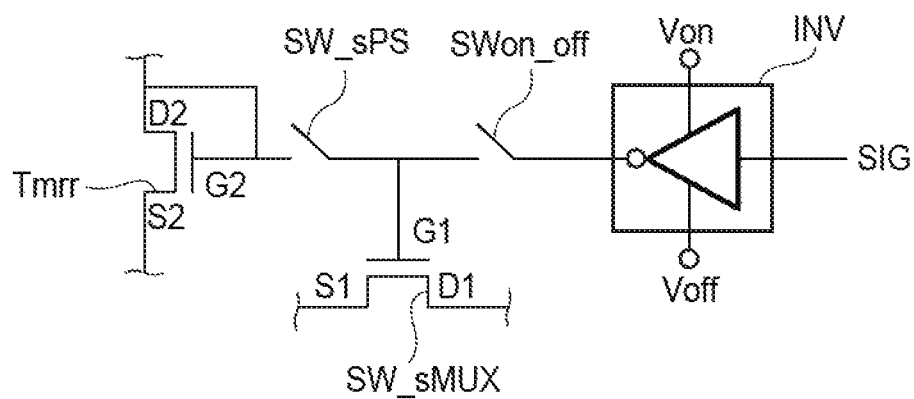
FIG. 12 is a diagram illustrating a configuration example according to a third modification.

FIG. 12 is a diagram illustrating a configuration example according to a third modification. In the third modification, a switch SWon_off and an inverter circuit INV are provided instead of the switches SWon and SWoff. The switch SWon_off is connected between the gate G1 of the switch SW_sMUX and an output of the inverter circuit INV. The inverter circuit INV connects the on-voltage source Von to the switch SWon_off or connects the off-voltage source Voff to the switch SWon_off on the basis of the logic of a signal SIG from the controller CNT. The switch SWon_off is, for example, an N-type or P-type MOSFET. The conductivity type of the MOSFET as the switch SWon_off is not particularly limited. It suffices that the inverter circuit INV is constituted by, for example, a CMOS (Complementary MOS).

The switches SW_sPS and SWon_off are controlled by the controller CNT in FIG. 2. For example, only one of the switch SW_sPS and SWon_off is selectively brought to the on-state and the other thereof keeps the off-state. More specifically, when the switch SW_sMUX is to be brought to the intermediate state, the switch SW_sPS is brought to the on-state and the switch SWon_off is brought to the off-state. When the switch SW_sMUX is to be brought to the on-state or the off-state, the switch SWon_off is brought to the on-state and the switch SW_sPS is brought to the off-state. In this case, the switch SW_sMUX is brought to the on-state or the off-state depending on the logic of the signal SIG. In this way, also with the configuration as illustrated in FIG. 12, the switch SW_sMUX can be brought to any one of the intermediate state, the on-state, and the off-state.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a plurality of first lines;
a plurality of second lines;
a plurality of memory cells arranged to correspond to intersection areas between the plurality of first lines and the plurality of second lines;
a detection circuit configured to detect data stored in the plurality of memory cells;
a first transistor electrically connected to the plurality of second lines between the plurality of memory cells and the detection circuit; and
a controller configured to bring the first transistor to an intermediate state between an on-state and an off-state and to thereafter bring the first transistor to the on-state to transmit a voltage of the second line to the detection circuit, in a data read operation, while a read voltage is applied to a first memory cell among the plurality of memory cells, the first memory cell being connected to a selected first line selectively driven from among the plurality of first lines and connected to a selected second line selectively driven from among the plurality of second lines, and the first transistor connected to the selected second line.

2. The device of claim 1, wherein the first memory cell passes a current according to the data when a voltage difference between the first and second lines connected to the first memory cell exceeds a first voltage, and decreases the current according to the data when the voltage difference falls below a second voltage lower than the first voltage, and the detection circuit detects data stored in the first memory cell on a basis of a current amount flowing in the first memory cell during a period when the voltage difference decreases from the first voltage to the second voltage.

3. The device of claim 1, wherein the first transistor causes leakage currents flowing in second memory cells connected to the selected second line and connected to non-selected first lines other than the selected first line among the plurality of memory cells to flow toward the detection circuit when in the intermediate state.

4. The device of claim 3, further comprising: a second transistor having a gate connected to a gate of the first transistor; and a current source connected in series to the second transistor.

5. The device of claim 4, wherein an expression 1 holds where a ratio between a size of the first transistor and a size of the second transistor is Rmrr, a current flowing in the first transistor is Imux, and a current flowing in the second transistor is Imrr, $$Imux=Rmrr\times Imrr \qquad \text{(expression 1)}.$$

6. The device of claim 4, wherein the current source is a third memory cell connected between a third line at a same voltage as that of the non-selected first lines and a fourth line at a same voltage as that of the selected second line.

7. The device of claim 6, wherein the third memory cell has a same configuration as that of the second memory cells.

8. The device of claim 6, wherein the third line is one of the non-selected first lines in a memory cell array including the first memory cell, and the fourth line is a line different from the selected second line among the plurality of second lines in the memory cell array including the first memory cell.

9. The device of claim 7, wherein the third line is one of the non-selected first lines in a memory cell array including the first memory cell, and the fourth line is a line different from the selected second line among the plurality of second lines in the memory cell array including the first memory cell.

10. The device of claim 6, wherein the third and fourth lines are arranged in a second memory cell array, the second memory cell array being different from a first memory cell array including the first memory cell and being arranged in a same chip as that of the first memory cell array.

11. The device of claim 7, wherein the third and fourth lines are arranged in a second memory cell array, the second memory cell array being different from a first memory cell array including the first memory cell and being arranged in a same chip as that of the first memory cell array.

12. The device of claim 1, further comprising: a third transistor electrically connected between the first transistor and the detection circuit; and a charge circuit configured to charge the plurality of second lines electrically connected between the first transistor and the third transistor, wherein the detection circuit comprises a first input terminal connected to the selected second line, and a second input terminal connected to non-selected second lines not driven in the data read operation, the charge circuit charges the selected second line and the non-selected second lines before detection of data, and the detection circuit compares a voltage of the non-selected second lines and a voltage of the selected second line with each other to detect data after the charge circuit finishes charging the selected second line and the non-selected second lines.

13. A semiconductor storage device comprising:
a plurality of first lines; a plurality of second lines;
a plurality of memory cells arranged to correspond to intersection areas between the plurality of first lines and the plurality of second lines;
a detection circuit configured to detect data stored in the plurality of memory cells;
a first transistor electrically connected to the plurality of second lines between the plurality of memory cells and the detection circuit;
a second transistor having a gate connected to a gate of the first transistor and configured to bring the first transistor to an intermediate state between an on-state and an off-state; and
a current source connected in series to the second transistor.

14. The device of claim 13, wherein an expression 1 holds where a ratio between a size of the first transistor and a size of the second transistor is Rmrr, a current flowing in the first transistor is Imux, and a current flowing in the second transistor is Imrr, $$Imux=Rmrr\times Imrr \qquad \text{(expression 1)}.$$

15. The device of claim 13, wherein the current source is a memory cell connected between a third line at a same voltage as that of non-selected first lines other than a selected first line selected from the plurality of first lines and a fourth line at a same voltage as that of a selected second line selected from the plurality of second lines, among the plurality of memory cells.

16. The device of claim 15, wherein the third line is one of the non-selected first line in a memory cell array including the first memory cell, and the fourth line is a line different from the selected second line among the plurality of second lines in the memory cell array including the first memory cell.

17. The device of claim 15, wherein the third and fourth lines, and the memory cell connected between the third line and the fourth line are arranged in a second memory cell array, the second memory cell array being different from a first memory cell array including the first memory cell connected to a selected first line selectively driven from among the plurality of first lines and a selected second line selectively driven from among the plurality of second lines, and the second memory cell array being arranged in a same chip as that of the first memory cell array.

18. The device of claim 13, wherein the current source is one of the plurality of memory cells, the memory cell being connected between one of the non-selected first lines and a line different from the selected second line among the second lines.

19. The device of claim 13, wherein the current source is one of the plurality of memory cells, the memory cell being connected between a third line and a fourth line arranged in a second memory cell array, the second memory cell array being different from a first memory cell array including the first memory cell and being arranged in a same chip as that of the first memory cell array.

20. The device of claim 13, further comprising a first power-supply switch connected between the gate of the first transistor and an on-voltage source, wherein
the second transistor brings the first transistor to the intermediate state, and thereafter the first power-supply switch brings the first transistor to the on-state to transmit a voltage of the second line to the detection circuit, in a data read operation, while a read voltage is applied to a first memory cell connected to a selected first line selectively driven from among the plurality of first lines and connected to a selected second line selectively driven from the plurality of second lines, and the first transistor is connected to the selected second line.

* * * * *